(12) United States Patent
Bindig et al.

(10) Patent No.: US 8,063,544 B2
(45) Date of Patent: Nov. 22, 2011

(54) MONOLITHIC BENDING ELEMENT

(75) Inventors: Reiner Bindig, Bindlach (DE); Kurt Handschuh, Eckental (DE); Claudia Voigt, Rothenbach (DE); Jürgen Schmidt, Marktredwitz (DE); Hans-Jürgen Schreiner, Neunkirchen am Sand-Rollhofen (DE)

(73) Assignee: Ceramtec GmbH, Plochingen (DE)

( * ) Notice: Subject to any disclaimer, the term of this patent is extended or adjusted under 35 U.S.C. 154(b) by 0 days.

(21) Appl. No.: 12/087,084

(22) PCT Filed: Dec. 15, 2006

(86) PCT No.: PCT/EP2006/069747
§ 371 (c)(1),
(2), (4) Date: Nov. 17, 2008

(87) PCT Pub. No.: WO2007/077107
PCT Pub. Date: Jul. 12, 2007

(65) Prior Publication Data
US 2009/0179526 A1 Jul. 16, 2009

(30) Foreign Application Priority Data

Jan. 2, 2006 (DE) .......................... 10 2006 000 698
Aug. 25, 2006 (DE) .......................... 10 2006 039 858

(51) Int. Cl.
*H01L 41/083* (2006.01)
(52) U.S. Cl. ........ 310/365; 310/363; 310/364; 29/25.35
(58) Field of Classification Search .................. 310/365, 310/364, 363; 29/25.35
See application file for complete search history.

(56) References Cited

U.S. PATENT DOCUMENTS

| | | | | |
|---|---|---|---|---|
| 5,196,757 A | * | 3/1993 | Omatsu | 310/358 |
| 5,729,262 A | * | 3/1998 | Akiyama et al. | 347/70 |
| 5,852,229 A | * | 12/1998 | Josse et al. | 73/24.06 |
| 5,923,115 A | * | 7/1999 | Mohr et al. | 310/334 |
| 6,623,845 B1 | * | 9/2003 | Katsumura et al. | 428/210 |
| 2002/0046861 A1 | | 4/2002 | Yokoyama et al. | |
| 2002/0109437 A1 | * | 8/2002 | Sorg et al. | 310/328 |
| 2003/0173874 A1 | * | 9/2003 | Bryant et al. | 310/365 |
| 2004/0012000 A1 | * | 1/2004 | Ponomarev et al. | 252/500 |
| 2005/0039532 A1 | * | 2/2005 | Ohsugi et al. | 73/580 |
| 2005/0093401 A1 | * | 5/2005 | Raisanen | 310/328 |
| 2005/0120528 A1 | * | 6/2005 | Okuda et al. | 29/25.35 |
| 2005/0183543 A1 | * | 8/2005 | Sasaki et al. | 75/371 |
| 2005/0206274 A1 | * | 9/2005 | Kobane et al. | 310/328 |
| 2006/0198079 A1 | * | 9/2006 | Shim et al. | 361/306.3 |

* cited by examiner

*Primary Examiner* — Walter Benson
*Assistant Examiner* — Bryan Gordon
(74) *Attorney, Agent, or Firm* — Fulbright & Jaworski L.L.P.

(57) ABSTRACT

A method for producing a component as monolithic multilayer element or multilayer bending element, comprising at least two layer stacks each having 1-400 layers of piezoelectrically active material which are separated by at least one layer stack comprising 0-100 layers of piezoelectrically inactive material, wherein the inner electrodes of the active layer stacks contain at least the following materials: a) pure silver b) electrically non-conductive material having a proportion by weight of 0% to at most 30% and the material of the piezoelectrically active layers has a sufficient activity in a thermal process such that sintering below the melting point of the material of the inner electrodes is possible and performed.

26 Claims, 6 Drawing Sheets

Fig. 5: Comparison of audio spectra:
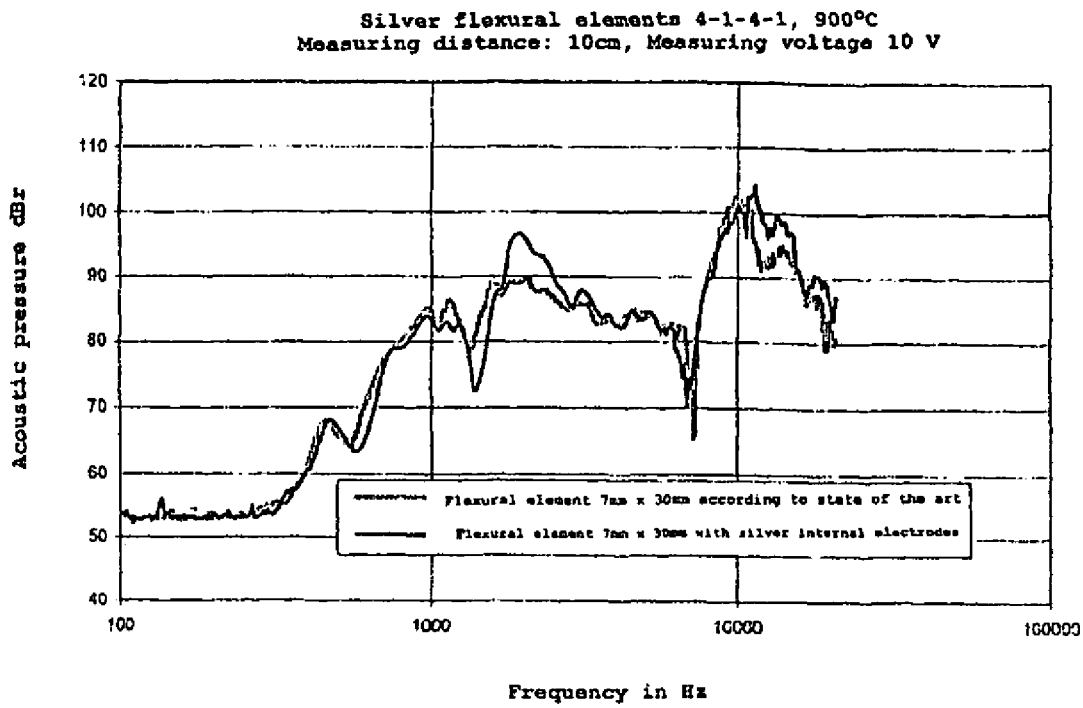
Fig. 6: Comparison of audio spectra:
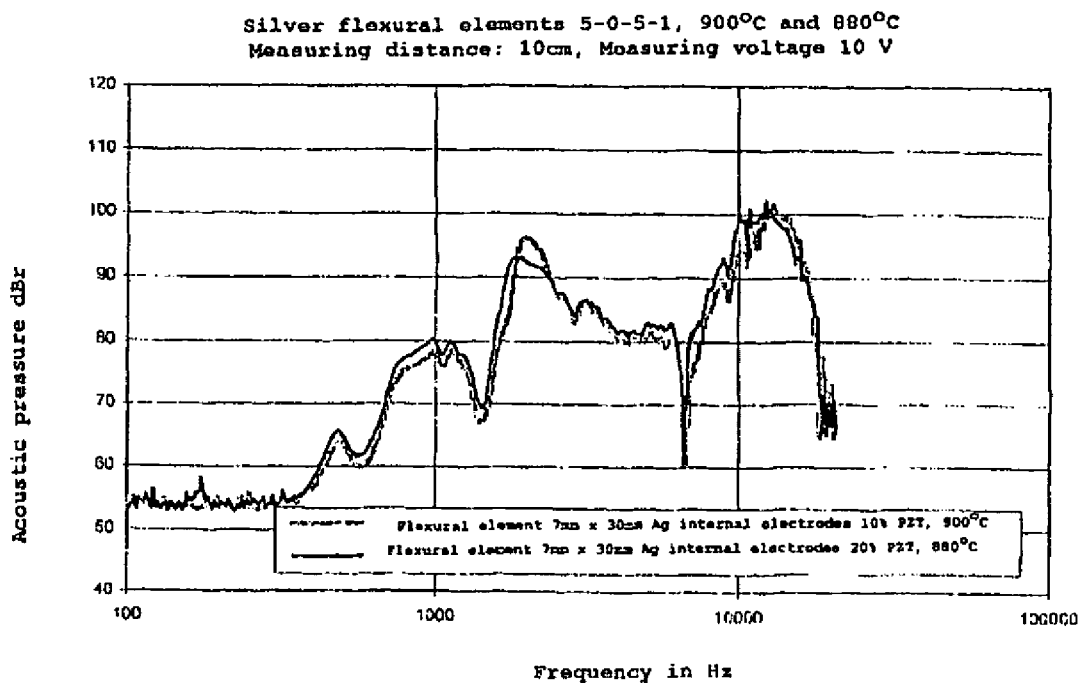

Fig. 7: Comparison of audio spectra:
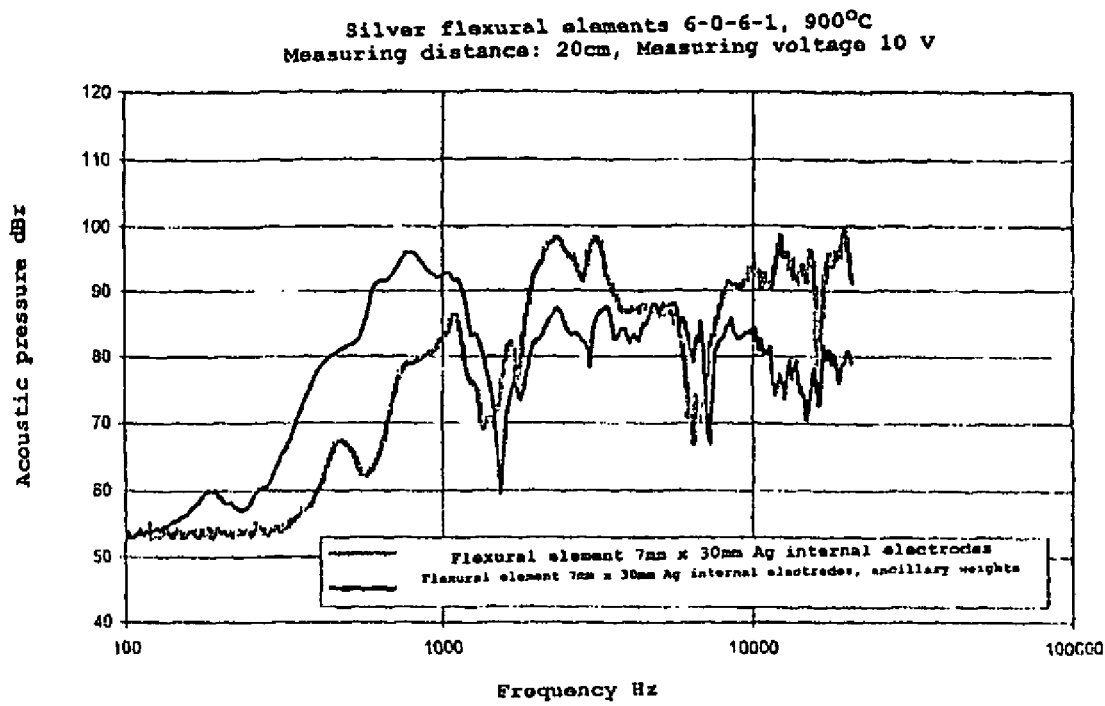
Fig. 8: Comparison of audio spectra:
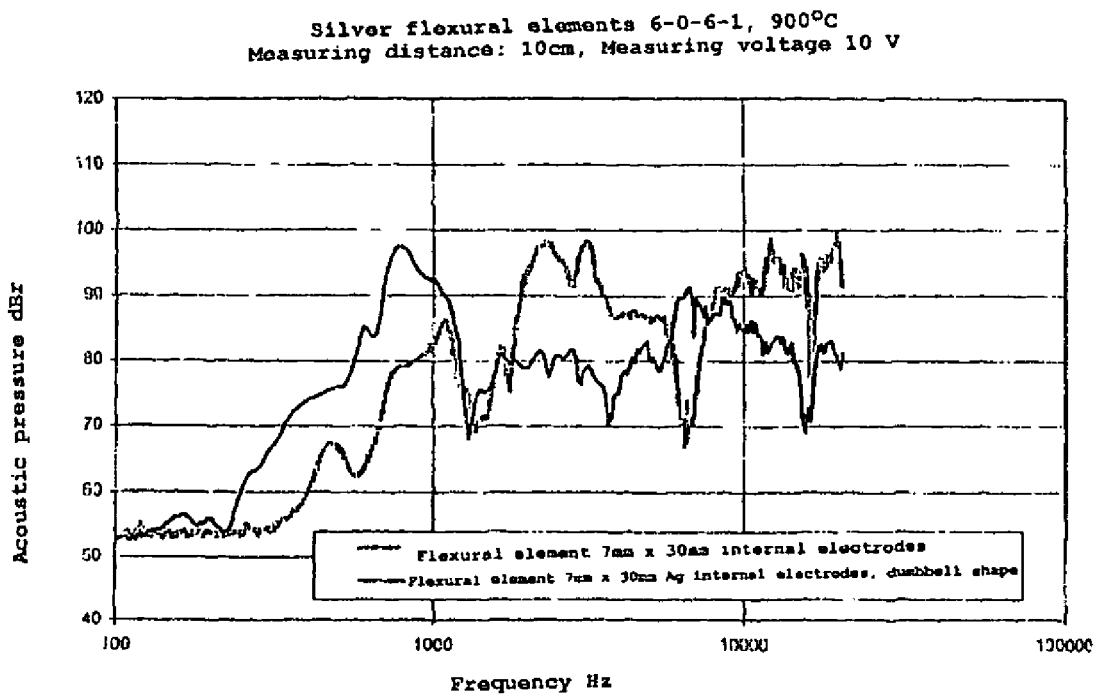

MONOLITHIC BENDING ELEMENT

This application is a §371 of PCT/EP2006/069747 filed Dec. 15, 2006, which claims priority from German Patent Application No: 10 2006 000 698.4 filed Jan. 2, 2006 and German Patent Application No: 10 2006 039 858.0 filed Aug. 25, 2006.

The invention relates to a process for producing a structural component in the form of a monolithic multilayer element or multilayer flexural element according to the precharacterising portion of Claim 1, to a structural component, and to the use of this structural component.

For the purpose of exciting oscillations in elastic materials, such as plastic structures or diaphragms, electrodynamic systems are normally employed. The objective in this case is to cause the sound waves of the structure to radiate in as wide a frequency band as possible with uniformly high acoustic pressure, or to damp an already oscillating structure in such a way that the acoustic radiation does not occur.

The disadvantage of electrodynamic vibration-generators is that they are voluminous and, with higher power outputs, also heavy. While maintaining a high acoustic pressure, they can only be miniaturised to a limited extent. Use in small-scale instruments is thus rendered difficult.

As an alternative, multilayer flexural elements based on piezoceramics find application. These flexural elements can be fitted to the oscillating structure in planar manner and require only very little installation space.

Given suitable fitment in small-scale instruments, they can generate high levels of acoustic pressure with very good sound quality. Use in large-scale instruments results in planar and lightweight systems.

However, the manufacturing technology of these structural components is very costly, and precious metal has to be used for the internal electrodes. For these reasons, the use of multilayer flexural elements on a mass scale is not possible. If larger structures, such as flat loudspeakers, are to be equipped with flexural elements of such a type, very many of them are required. Here too, use is out of the question for reasons of cost.

In addition, flexural elements of such a type in conjunction with the oscillating structure have a series of points of resonance at defined frequencies, and hence a characteristic tone colour of the radiated sound. It has been shown that the geometry of the flexural element has to be optimised for each oscillating structure for a wide-band, neutral radiation of sound. For larger structures with many flexural elements, flexural elements having various geometries must, in turn, be employed simultaneously for this purpose. With the process according to the invention (see further below), it is possible for the most diverse flexural geometries to be realised without difficulty.

According to the state of the art, piezoceramic multilayer structural components are sintered in air at approximately 1100° C. Therefore only a precious metal having a high melting-temperature can be used by way of internal electrode. Base metals would oxidise. Normally, therefore, use is made of a silver-palladium alloy with up to 40% palladium. However, this is associated with high material costs.

The object underlying the invention is to eliminate the disadvantages of the state of the art.

Silver is not deemed to be a precious metal in the following description, even though, considered electrochemically, it pertains to the precious metals.

The structural component according to the invention preferably contains pure silver without other precious-metal content by way of internal electrode. Since silver melts at 961° C. and this temperature falls still further in the presence of piezoceramic material, a sintering temperature of 950° C. must not be exceeded. This objective is achieved by means of three measures:

1. A PZT ceramic sintering at low temperatures has to be employed. Co-doped PZT systems are suitable, such as are described in DE 198 40 488 A1, for example. The material additionally has to be ground as finely as possible, in order to achieve a high sintering activity.
2. The PZT material has to be robust as regards the inward diffusion of silver in the course of sintering. The silver that diffuses inwards out of the internal electrode further lowers the sintering temperature considerably. However, it has to influence the piezomechanical properties of the material as little as possible. The co-doped PZT systems that have been described are also suitable here.
3. The internal electrode has to be stabilised by additions of PZT or related types of ceramic, since it otherwise largely diffuses into the ceramic, changes its properties, or loses its conductivity.

By virtue of the combination, according to the invention, of the three measures, it is possible to lower the sintering temperature to below 900° C. and to produce a multilayer flexural element that as a sonic transducer possesses the same characteristics as a precious-metal-containing flexural transducer according to the state of the art.

The invention accordingly relates to a process for producing a structural component in the form of a monolithic multilayer element or multilayer flexural element, with at least two layer stacks with, in each case, 1-400 layers of piezoelectrically active material, which are separated by at least one layer stack consisting of 0-100 layers of piezoelectrically inactive material, wherein the internal electrodes of the active layer stacks contain at least the following materials:
  a) pure silver
  b) electrically non-conductive material with a proportion by weight from 0% to a maximum of 30% and the material of the piezoelectrically active layers has sufficient activity in a thermal process such that sintering is possible below the melting-temperature of the material of the internal electrodes, and is also performed.

The layer stack comprising the piezoelectrically inactive material may accordingly also be dispensed with.

The layer stacks of the piezoelectrically active material are advantageously composed of fewer than 100 layers, preferably of one to 10 layers.

The layer stacks of the piezoelectrically inactive material are preferably composed of one to 10 layers.

In one embodiment according to the invention, in the initial state prior to sintering the silver of the internal electrodes is present in the form of spherical particles (powder).

For the electrically non-conductive material of the internal electrodes, a proportion by weight of less than 20%, preferably less than 15%, is advantageously used.

In one embodiment, additionally a metal alloy or a metallic-oxide mixture consisting of no more than 30% precious metal with the exception of silver is added to the material of the internal electrodes.

The proportion of the added metal alloy or metallic-oxide mixture may exhibit a proportion of less than 10%, preferably less than 5% or even 0%.

Percentage statements in the entire description always mean percentages by weight.

In a preferred embodiment, palladium or platinum is used by way of metal alloy or metallic-oxide mixture.

By way of electrically non-conductive material of the internal electrodes, use is preferably made of lead zirconate titanate (PZT), in particular consisting of a co-doped material with a proportion of 5%-15%.

A temperature of 950° C. must not be exceeded in the course of sintering, since silver melts at 961° C.

The piezoelectrically active layer stacks are expediently each covered with a film of dielectric material which is applied, for example, in the form of thick-film paste.

The connection of the internal-electrode films of one polarity is advantageously established by means of internal connections (vias).

The vias are preferably applied prior to sintering.

In one embodiment of the invention, foil technology and thick-film technology are employed.

A structural component according to the invention in the form of a monolithic multilayer element or multilayer flexural element, in particular produced by the process according to one of Claims 1 to 14, is characterised in that the structural component consists of at least two layer stacks with, in each case, 1-400 layers of piezoelectrically active material, which are separated by at least one layer stack consisting of 0-100 layers of piezoelectrically inactive material, wherein the internal electrodes of the active layer stacks contain at least the following materials:

a) pure silver and
b) electrically non-conductive material with a proportion by weight from 0% to a maximum of 30%.

The piezoelectrically active layers are thinner than 200 μm and are preferably between 15 μm and 100 μm thick.

The piezoelectrically active layer stacks are covered on the underside and on the upper side of the structural component with, in each case, a passive surface film of dielectric material.

Planar contact regions, thick-film resistors or balancing networks are applied onto the passive surface film, preferably at the fixing-point.

The structural component may exhibit an arbitrary planar shape, in particular may be a rectangle, a round or oval disc, a star shape, a dumbbell or spoon shape.

The shape of the structural component is preferably chosen in such a way that at a given fixing-point the regions of maximal amplitude of oscillation exhibit the maximal mass, so that the force transmitted to the fixing-point is maximal.

The regions of maximal amplitude of oscillation are advantageously provided with additional masses at a given fixing-point, so that the force transmitted to the fixing-point is maximal.

The relationship $$\int_0^L a(x,t) \cdot \rho(x) \cdot b(x) \cdot t(x) \, dx$$

is preferably maximised by the shape of the structural component at a given time t, where
a(x) is the acceleration at point x at time t,
b(x) is the width at point x,
t(x) is the thickness at point x and
ρ(x) is the density of the structural component at point x, and x denotes the distance from the fixed point, and L denotes the maximal distance from this fixed point.

The structural component is preferably used for the purpose of exciting or accepting oscillations in arbitrary structures, which has the result that the oscillations of the structure are converted into electrical signals or the structure radiates sound.

According to the invention, the structural component can be used as a microphone or loudspeaker.

The structural component can also be used in order to excite antiphase oscillations in arbitrary oscillating structures, which has the result that the oscillation in the structure is extinguished or at least damped.

The use of the structural component as a sensor for oscillations or as an actuator for triggering oscillations is preferred.

Further features of the invention will become apparent from the Figures which are described below.

FIG. 1 shows a multilayer flexural element, the active layer stacks 1 of which contain electrodes made of material that is free of precious metal. The active layer stacks are electrically contacted with the aid of the external metallization 4. The structural component is provided with surface layers 3 made of PZT, which ensure the electrical insulation and are able to accept the terminal areas 5. A preferred process according to the invention is characterised in that the piezoelectrically active layer stacks are each covered with a film of dielectric material (3) which is applied, for example, in the form of thick-film paste.

FIG. 2 shows two possibilities for influencing the oscillations generated by a flexural element and for raising the lower frequencies at the expense of the higher frequencies. In (a) this is brought about by fitting of ancillary masses 6, in (f) by a spoon-like shaping 7 of the flexural element. The masses in (a) act preferentially by virtue of their inertial force; the spoon-shaped regions, on the other hand, act preferentially by virtue of their air resistance.

FIG. 3 shows possible designs of the flexural elements. In (a) the rectangular standard shape is represented. The round shapes (b) and (c) have a clearly higher rigidity and can also excite massive structures to execute oscillations. The dumbbell shape (d) and the spoon shape (f) are more likely to be suitable for lower frequencies. The star shape (e) can be tuned neutrally in terms of sound characteristics by another tuning mass 6 being fitted to each flexural member. FIG. 3g shows a star-shaped flexural element with a via through-connection 11 and tuning masses 6.

FIG. 5 shows the audio spectra of a flexural element with noble-metal-containing internal electrodes according to the prior art and with a flexural element according to the invention with silver internal electrodes (Example 1 and Example 2).

FIG. 6 shows the audio spectra of two flexural elements according to the invention with various silver internal electrodes, sintered at various temperatures (Example 3 and Example 4).

FIG. 7 shows the audio spectra of two flexural elements according to the invention, with and without ancillary masses (Example 6 and Example 5).

FIG. 8 shows the audio spectra of two flexural elements according to the invention, with and without dumbbell shape (Example 7 and Example 5).

Production of a Structural Component According to the Invention:

For the purpose of producing flexural elements according to the invention, use is made of foil technology. The described procedure and the described parameters reproduce only one example. Similar procedures and parameters are immediately apparent to a person skilled in the art.

The starting-point is a calcined PZT material according to DE 198 40 488, for example $0.98Pb(Zr_{0.53}Ti_{0.47})O_3\text{-}0.02Sr(K_{0.25}Nb_{0.75})O_3$. The material is precrushed and ground in an annular-gap ball mill to an average grain size of 0.8 µm.

From the resulting powder, a casting slip is prepared in accordance with the state of the art and is cast to form a continuous foil, dried, and rolled up. Suitable for this are, for example, casting belts which operate in accordance with the doctor-blade process. In this example the foil has a thickness of 70 µm after drying, and a thickness 60 µm after sintering.

The foil is divided into sections of about 200 mm×200 mm. The internal-electrode pattern is imprinted by means of screen printing. The subsequent dimensions of the flexural element are defined by the shape of the print layout. For the example to be described here, the subsequent dimensions amount to 7 mm×30 mm.

The internal-electrode paste is produced from a mixture of silver powder with a proportion of 10% of the PZT powder described above. Binders such as ethylcellulose and solvents such as terpineol provide for good spreadability of the paste. The paste is printed on in such a way that the thickness of the internal electrode after sintering amounts to about 3 µm.

Figure 1:
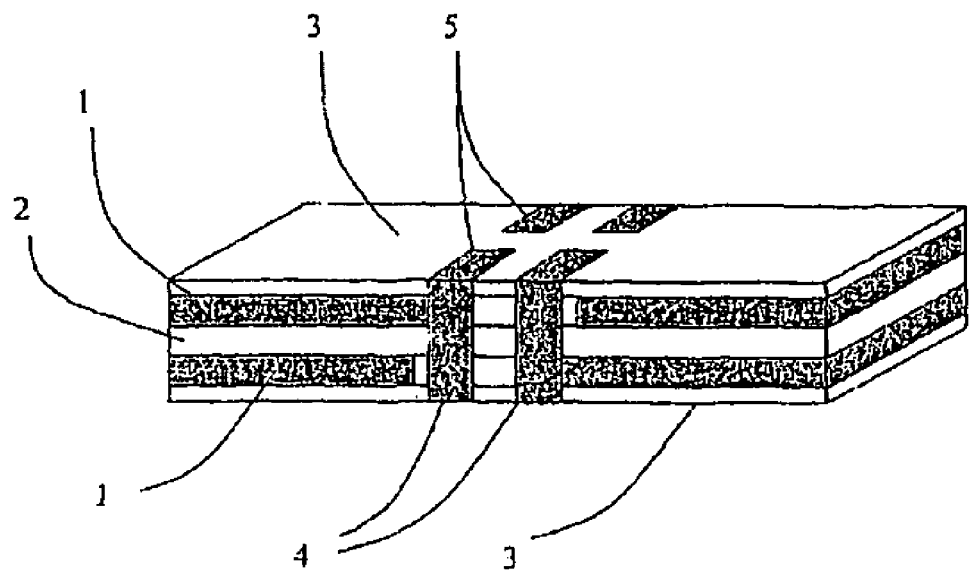
Figure 2:
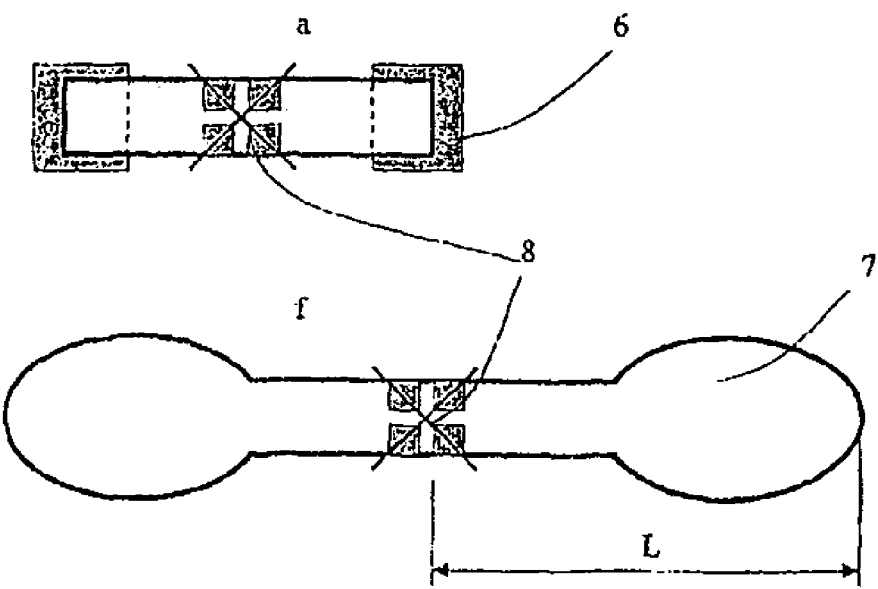
Figure 3:
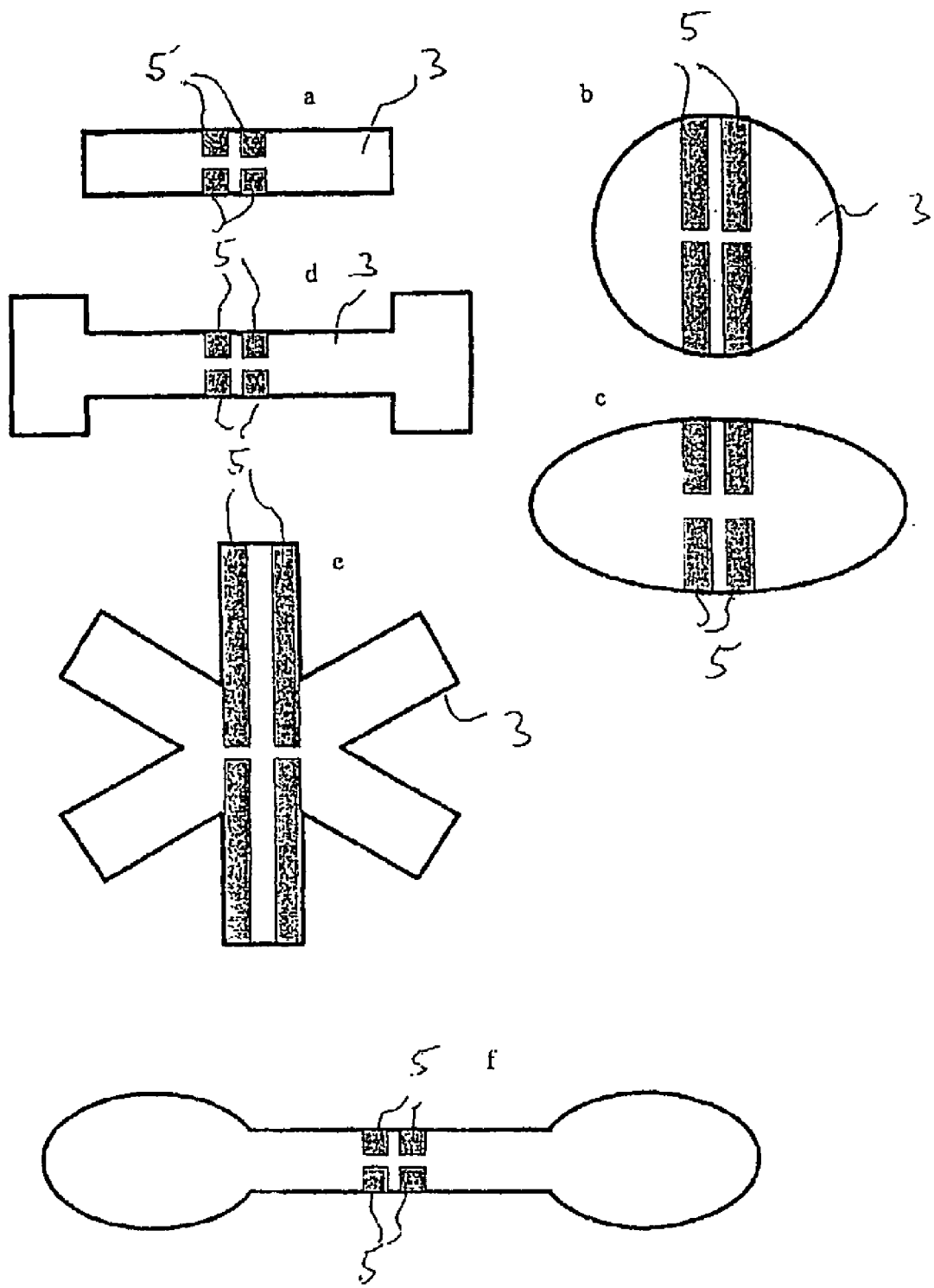
Figure 3G:
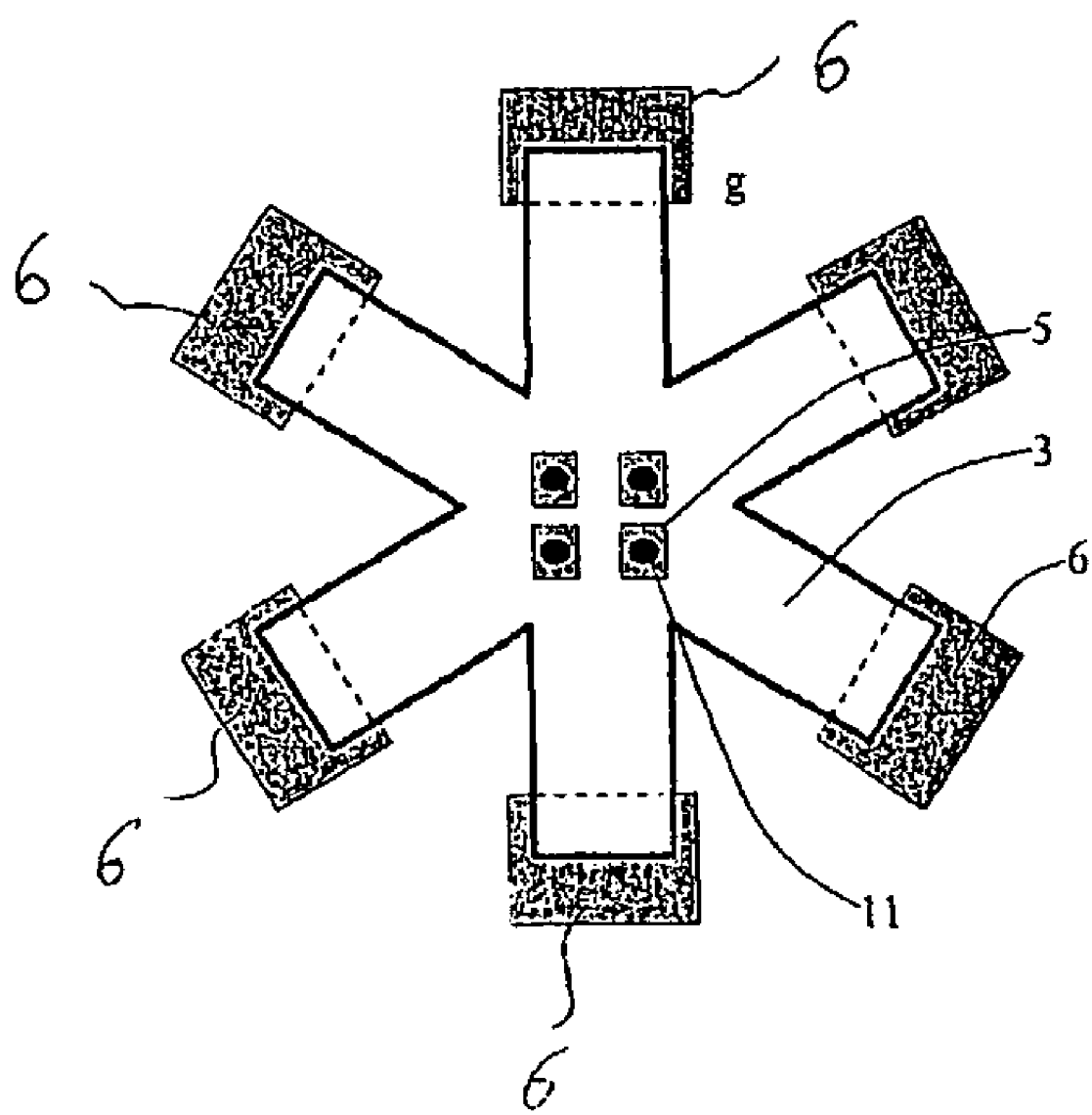
Figure 4:
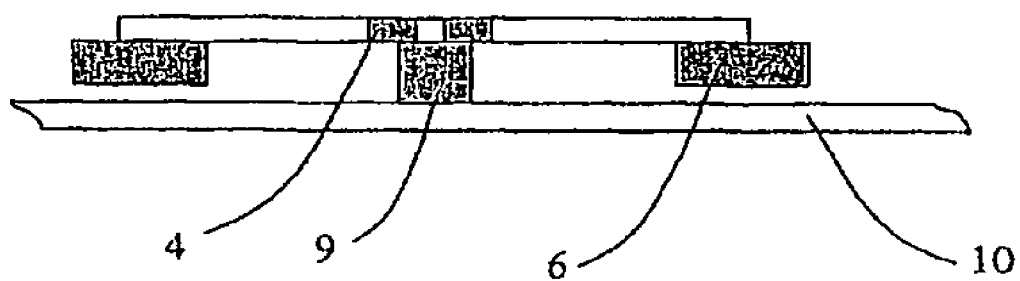
FIG. 4 shows the possible fitting of a flexural element to an oscillating structure 10 by means of a coupling element 9. The mechanical properties of the coupling element and of the bond (rigidity) influence above all the high frequencies.

The printed and dried foil sections are stacked in such a way that the structure of the flexural transducer arises. For the example to be described here, firstly four printed foils, one unprinted foil, four imprinted foils and again one unprinted foil are stacked one above the other. As a result, a flexural element arises that exhibits a passive layer 3 on each side, on both sides a stack 1 of three active layers in each case, and centrally two passive layers 2 (FIG. 1).

The stacked foils are now pressed together, in accordance with the state of the art, at elevated pressure and temperature so as to form a laminate.

The laminate is now separated into the flexural elements predetermined by the print layout by, for example, sawing or stamping.

The flexural elements are freed of the binder portions at a temperature of 500° C. and subsequently sintered at 900° C.

The sintered structural components are ground on the narrow sides and imprinted with a basic metallisation 4 consisting of a commercial silver thick-film paste.

Terminal areas 5 are printed onto the exterior surface film with the same paste. The metallisation is stoved in accordance with the manufacturer's instructions.

By application of a voltage of 120 V, the structural components are now polarised in such a way that a polarisation that is continuous in one direction arises in the two layer stacks 1.

The terminal areas are now connected in such a way that the flexural element is operated in bipolar manner. A supporting element 10 which establishes the connection to the oscillating structure 9 is now adhesion-bonded underneath the centre of the structural component. The supporting element should be small, lightweight, and as rigid as possible. Normally good results are obtained if use is made of the same material that the oscillating structure consists of. But other fastening options which impart a different oscillation characteristic to the composite in each case are also obvious to a person skilled in the art.

EXAMPLES

Example 1

A multilayer flexural element having the dimensions 7 mm×30 mm×0.6 mm is produced by the procedure described above (structure 4-1-4-1). By way of internal electrode material, use is made of a commercial metal paste with AgPd 70/30 alloy of the metal portion. The structural components are sintered at 1000° C.

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (grey line) represented in FIG. 5 arises.

Example 2

A multilayer flexural element having the dimensions 7 mm×30 mm×0.6 mm is produced by the procedure described above (structure 4-1-4-1). By way of internal-electrode material, use is made of a mixture consisting of pure silver powder (90%) and finely ground PZT powder (10%). The mixture is stirred together with ethylcellulose and terpineol to form a paste that contains 50% of the mixture. The structural components are sintered at 900° C.

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (black line) represented in FIG. 5 arises.

It is apparent that the structural component according to the invention generates an acoustic-pressure spectrum that is almost identical to that of a structural component according to the state of the art.

Example 3

A multilayer flexural element having the dimensions 7 mm×30 mm×0.66 mm is produced by the procedure described above (structure 5-0-5-1). By way of internal-electrode material, use is made of a mixture consisting of pure silver powder (90%) and finely ground PZT powder (10%). The mixture is stirred together with ethylcellulose and terpineol to form a paste that contains 50% of the mixture. The structural components are sintered at 900° C.

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (grey line) represented in FIG. 6 arises.

Example 4

A multilayer flexural element having the dimensions 7 mm×30 mm×0.66 mm is produced by the procedure described above (structure 5-0-5-1). By way of internal-electrode material, use is made of a mixture consisting of pure silver powder (80%) and finely ground PZT powder (20%). The mixture is stirred together with ethylcellulose and terpineol to form a paste that contains 50% of the mixture. The structural components are sintered at 880° C.

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (black line) represented in FIG. 6 arises.

The comparison with the structural component from Example 3 shows no significant differences.

Example 5

A multilayer flexural element having the dimensions 7 mm×30 mm×0.78 mm is produced by the procedure described above (structure 6-0-6-1). By way of internal-electrode material, use is made of a mixture consisting of pure silver powder (90%) and finely ground PZT powder (10%). The mixture is stirred together with ethyl-cellulose and terpineol to form a paste that contains 50% of the mixture. The structural components are sintered at 900° C.

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$ (volts, peak to peak).

The acoustic-pressure spectrum (grey line) represented in FIG. 7 arises.

Example 6

A multilayer flexural element from Example 5 is provided at the ends with additional metal weights, each of 2.8 g. For the purpose of joining, use is made of a highly elastic adhesive (silicone).

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (black line) represented in FIG. 7 arises.

The comparison of the two structural components shows that the low frequencies are clearly raised by the ancillary weights, whereas the level of the high frequencies is lowered.

Example 7

A multilayer flexural element from Example 5 is provided at the ends with additional surfaces having a size of 21 mm×20 mm×0.63 mm consisting of aluminium-oxide substrates. The overlap with the flexural element amounts to 5 mm, so that a dumbbell-like shape arises. For the purpose of joining, use is made of a highly elastic adhesive (silicone).

The flexural element is incorporated into a standard plastic box having the dimensions 120 mm×90 mm×15 mm and installed in an audio measuring station. The distance to the measuring microphone amounts to 10 cm; the measuring voltage amounts to 10 $V_{pp}$.

The acoustic-pressure spectrum (black line) represented in FIG. 8 arises.

The comparison with the flexural element without dumbbell shape (grey line) shows that the low frequencies are clearly raised by the dumbbell shape, whereas the level of the high frequencies is lowered.

The invention claimed is:

1. A process for producing a structural component in the form of a monolithic multilayer element or multilayer flexural element, with at least two layer stacks, wherein each stack comprises 1-400 layers of piezoelectrically active material, which are separated by one layer stack comprising 0-100 layers of piezoelectrically inactive material, wherein the internal electrodes of the active layer stacks contain the following internal electrode materials:
   a) pure silver without any other precious metal content; and
   b) electrically non-conductive material comprising lead zirconate titanate with a proportion by weight less than 20%;
   wherein the material of the piezoelectrically active layers has sufficient activity in a thermal process such that sintering is possible below the melting-temperature of the material of the internal electrodes, and wherein the material is sintered at a temperature below the melting point of the internal electrode materials, and wherein a temperature of 950° C. is not exceeded during sintering and said process comprises the steps of
   i) grinding a calcined PZT material into powder;
   ii) casting the resulting powder into a foil and dividing the foil into sections;
   iii) imprinting an internal-electrode paste onto the foil;
   iv) stacking and pressing the sections of the foil to form a laminate;
   v) separating the laminate into flexural elements.

2. A process according to claim 1, wherein the layer stacks of the piezoelectrically active material are composed of fewer than 100 layers.

3. A process according to claim 1, wherein the layer stacks of the piezoelectrically inactive material are composed of one to 10 layers.

4. A process according to claim 1, wherein in the initial state prior to sintering the silver of the internal electrodes is present in the form of spherical particles.

5. A process according to claim 1, wherein the non-conductive material of the inner electrodes is lead zirconate titanate.

6. A process according to one of claim 1, wherein the piezoelectrically active layer stacks are each covered with a film of dielectric material.

7. A process according to claim 1, wherein the connection of the internal-electrode films of one polarity is established with vias.

8. A process according to claim 7, wherein the vias are attached prior to sintering.

9. A structural component in the form of a monolithic multilayer element or multilayer flexural element produced by the process according to claim 1.

10. A structural component according to claim 9, wherein the piezoelectrically active layers are thinner than 200 μm.

11. A structural component according to claim 9, wherein the piezoelectrically active layer stacks are covered on the underside and on the upper side of the structural component with, in each case, a passive surface film of dielectric material.

12. A structural component according to claim 11, wherein planar contact regions, thick-film resistors or balancing networks are applied onto the passive surface film.

13. A structural component according to claim 11, wherein the structural component exhibits an arbitrary planar shape, in particular is a rectangle, a round disc, an oval disc, a star shape, a dumbbell shape or a spoon shape.

14. A structural component according to claim 11, wherein the shape of the structural component is chosen in such a way that at a given fixing-point the regions of maximal amplitude of oscillation exhibit the maximal mass, so that the force transmitted to the fixing-point is maximal.

15. A structural component according to claim 11, wherein at a given fixing-point regions of maximal amplitude of oscillation are provided with additional masses, so that the force transmitted to the fixing-point is maximal.

16. A structural component according to claim 11, wherein the relationship:

$$\int_0^L a(x,t) \cdot \rho(x) \cdot b(x) \cdot t(x) \, dx$$

is maximised by the shape of the structural component at a given time t, where
- a(x) is the acceleration at point x at time t,
- b(x) is the width at point x,
- t(x) is the thickness at point x and
- ρ(x) is the density of the structural component at point x, and x denotes the distance from the fixed point and L denotes the maximum distance from this fixed point.

17. A method comprising using a structural component according to claim 11 for the purpose of exciting or accepting oscillations in arbitrary structures, which has the result that the oscillations of the structure are converted into electrical signals or the structure radiates sound.

18. The method of claim 17, wherein the use is as a microphone or loudspeaker.

19. The use of a structural component according to claim 17 in order to excite antiphase oscillations in arbitrary oscillating structures, wherein the oscillation in the structure is extinguished.

20. The method of claim 17, wherein the structural component is used as a sensor for oscillations or as an actuator for triggering oscillations.

21. A process according to claim 1, wherein the internal electrodes of the active layer stacks consist of the following internal electrode materials:
   a) pure silver without any other precious metal content; and
   b) electrically non-conductive material comprising lead zirconate titanate with a proportion by weight less than 20%.

22. A structural component in the form of a monolithic multilayer element or multilayer flexural element produced by the process according to claim 21.

23. A process for producing a structural component in the form of a monolithic multilayer element or multilayer flexural element, with at least two layer stacks, wherein each stack comprises 1-400 layers of piezoelectrically active material, which are separated by one layer stack comprising 0-100 layers of piezoelectrically inactive material, wherein the internal electrodes of the active layer stacks contain the following internal electrode materials:
   a) pure silver without any other precious metal content; and
   b) electrically non-conductive material comprising lead zirconate titanate with a proportion by weight less than 15%;
   wherein the material of the piezoelectrically active layers has sufficient activity in a thermal process such that sintering is possible below the melting-temperature of the material of the internal electrodes, and wherein the material is sintered at a temperature below the melting point of the internal electrode materials, and wherein a temperature of 950° C. is not exceeded during sintering and said process comprises the steps of
   i) grinding a calcined PZT material into powder;
   casting the results powder into a foil and dividing the foil into sections;
   iii) imprinting an internal-electrode paste onto the foil;
   iv stacking pressing the sections of the foil to form a laminate;
   v) separating the laminate into flexural elements.

24. A process according to claim 2, wherein the non-conductive material of the inner electrodes is lead zirconate titanate.

25. A process according to claim 3, wherein the non-conductive material of the inner electrodes is lead zirconate titanate.

26. A process according to claim 4, wherein the non-conductive material of the inner electrodes is lead zirconate titanate.

* * * * *